United States Patent
Nishi

[11] Patent Number: 5,842,824
[45] Date of Patent: *Dec. 1, 1998

[54] SUBSTRATE TRANSPORT APPARATUS

[75] Inventor: Kenji Nishi, Kanagawa-ken, Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 958,872

[22] Filed: Oct. 27, 1997

Related U.S. Application Data

[63] Continuation of Ser. No. 629,384, Apr. 8, 1996, abandoned.

[30] Foreign Application Priority Data

Apr. 12, 1995 [JP] Japan ................................. 7-086579

[51] Int. Cl.⁶ .............................. B65G 1/06; B65G 47/24
[52] U.S. Cl. ........................ 414/225; 414/416; 414/752; 414/936; 414/938; 414/811; 414/816
[58] Field of Search ..................... 414/225, 752, 414/416, 786, 936, 938, 941, 811, 816; 294/64.1, 65; 901/40; 198/375

[56] References Cited

U.S. PATENT DOCUMENTS

| | | |
|---|---|---|
| 4,586,743 | 5/1986 | Edwards et al. ................ 414/938 X |
| 4,699,556 | 10/1987 | Foulke ............................. 414/938 X |
| 4,778,331 | 10/1988 | Kimata et al. ................... 414/752 X |
| 4,778,332 | 10/1988 | Byers et al. ..................... 414/936 X |
| 4,846,626 | 7/1989 | Engelbrecht .................... 414/936 X |
| 5,504,345 | 4/1996 | Bartunek et al. ................ 414/936 X |

FOREIGN PATENT DOCUMENTS

| | | | |
|---|---|---|---|
| 211096 | 7/1984 | Germany | ................. 414/752 |
| 47728 | 2/1993 | Japan | ..................... 414/941 |

*Primary Examiner*—David A. Bucci
*Attorney, Agent, or Firm*—Armstrong, Westerman, Hattori, McLeland and Naughton

[57] ABSTRACT

A wafer cassette for storing a wafer is provided vertically above (direction Z) a transport path for a wafer which is carried by a robot arm driven by a drive mechanism to move along a transport guide extending from a wafer inlet from a wafer outlet. The wafer cassette is disposed at a position between the inlet and a pre-alignment mechanism. The wafer cassette is supported by a cassette retaining base. Drive members driven by a wafer up-down mechanism are fixed to both ends of the cassette retaining base which face opposite each other in a direction perpendicular to the transport path. Thus, the wafer cassette is vertically moved by the wafer up-down mechanism to deliver a wafer between the robot arm and the wafer cassette.

23 Claims, 7 Drawing Sheets

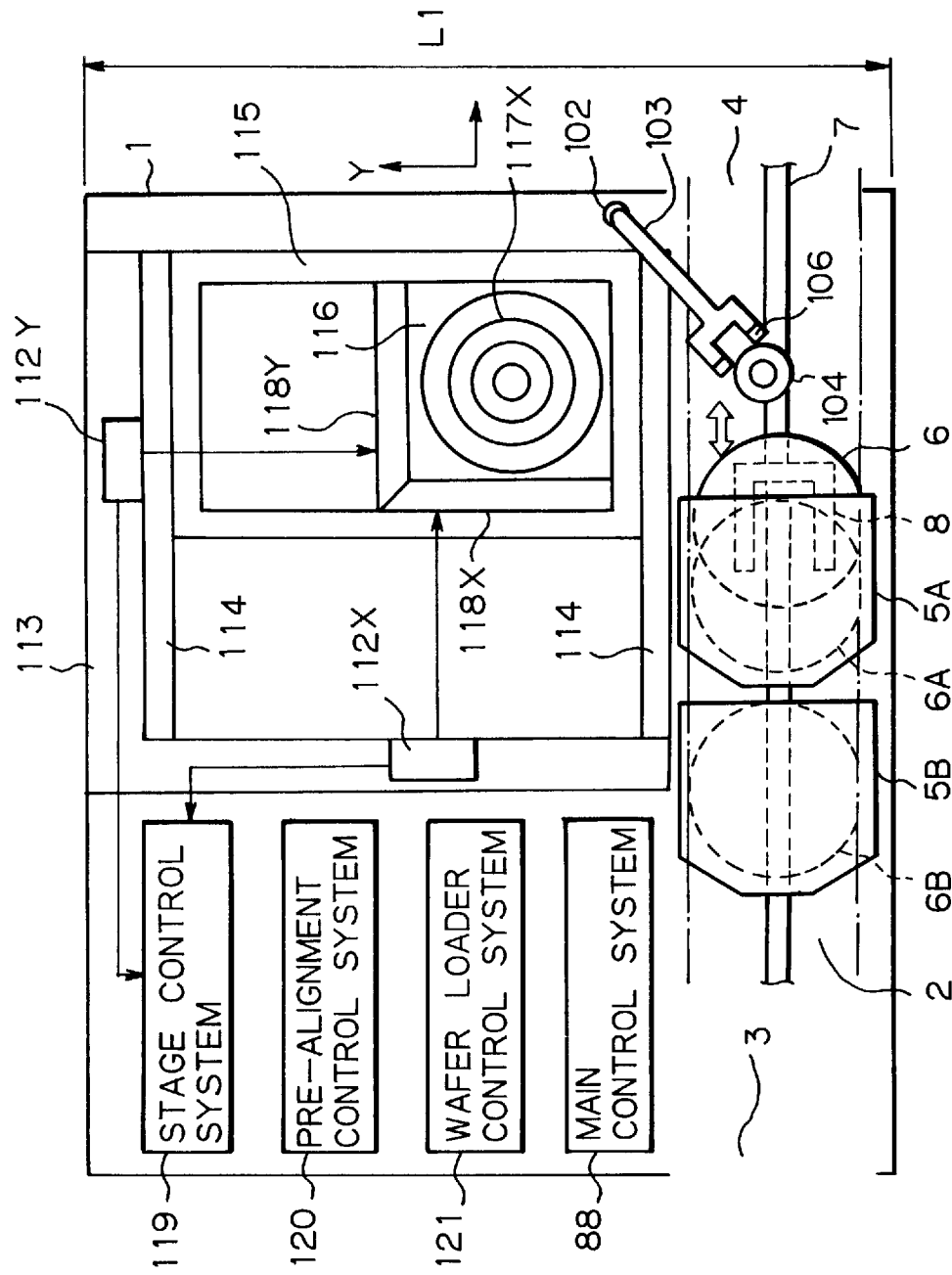

SUBSTRATE TRANSPORT APPARATUS

This application is a continuation of application Ser. No. 08/629,384 filed Apr. 8, 1996, now abandoned.

BACKGROUND OF THE INVENTION

The present invention relates to an apparatus for transporting a substrate. More particularly, the present invention relates to a technique suitably applied to an apparatus for carrying a photosensitive substrate to a position where pre-alignment is carried out for an exposure system to project a pattern formed on a mask onto the photosensitive substrate.

A projection exposure system (e.g. a stepper) employed in a photolithographic process for producing semiconductor devices, liquid crystal display devices, etc. uses a substrate transport apparatus to load and unload a substrate, e.g. a wafer or a glass plate, onto and from a substrate stage.

In a known substrate transport apparatus, a linear transport path is provided to extend as far as a position adjacent to a substrate stage of a projection exposure system, and a substrate is carried to the position adjacent to the substrate stage by a transport device which moves along the transport path. Then, the substrate is moved onto the substrate stage by a transfer device.

In the substrate transport apparatus, if a substrate once placed on the substrate stage has failed to be normally exposed, the defective substrate is returned to the substrate transport path and then put in a substrate cassette or other storage member which is disposed along the substrate transport path. The cassette is also used for the purpose of supplying a new substrate from among a multiplicity of substrates stored therein.

Such a substrate cassette is disposed to face opposite the substrate stage across the substrate transport path. Consequently, the overall size of the projection exposure system is disadvantageously large in a direction perpendicular to the substrate transport path. Further, since each substrate is carried along the substrate transport path in a horizontal position, a sufficiently wide space is needed between the substrate transport path and the substrate cassette; this also causes the above-described size of the system to increase. The problem will become even more serious if larger substrates are used in future (the use of 12-inch substrates is expected).

SUMMARY OF THE INVENTION

To solve the above-described problem, the present invention provides a substrate transport apparatus which is adapted to load and unload a substrate into and from an exposure system for transferring a mask pattern onto the substrate. The substrate transport apparatus has a storage member for storing the substrate, which is disposed vertically above or below a transport path for the substrate, and a transfer device for transferring the substrate between the transport path and the storage member.

In addition, the present invention provides a substrate transport apparatus which is adapted to load and unload a substrate into and from an exposure system for transferring a mask pattern onto the substrate. The substrate transport apparatus has a transport path for the substrate, and a device for holding the substrate perpendicular or oblique to the horizontal plane, so that the substrate is carried in a state of being held perpendicular or oblique to the horizontal plane.

BRIEF DESCRIPTION OF THE DRAWINGS

FIGS. 1A to 1C schematically show the arrangement of one embodiment of the substrate transport apparatus according to the present invention.

DETAILED DESCRIPTION

Prior to the description of embodiments of the present invention, one of conventional substrate transport apparatuses will be explained below to facilitate the understanding of the present invention. In the following, the substrate is a wafer, and the apparatus is a wafer transport apparatus.

Figure 6:
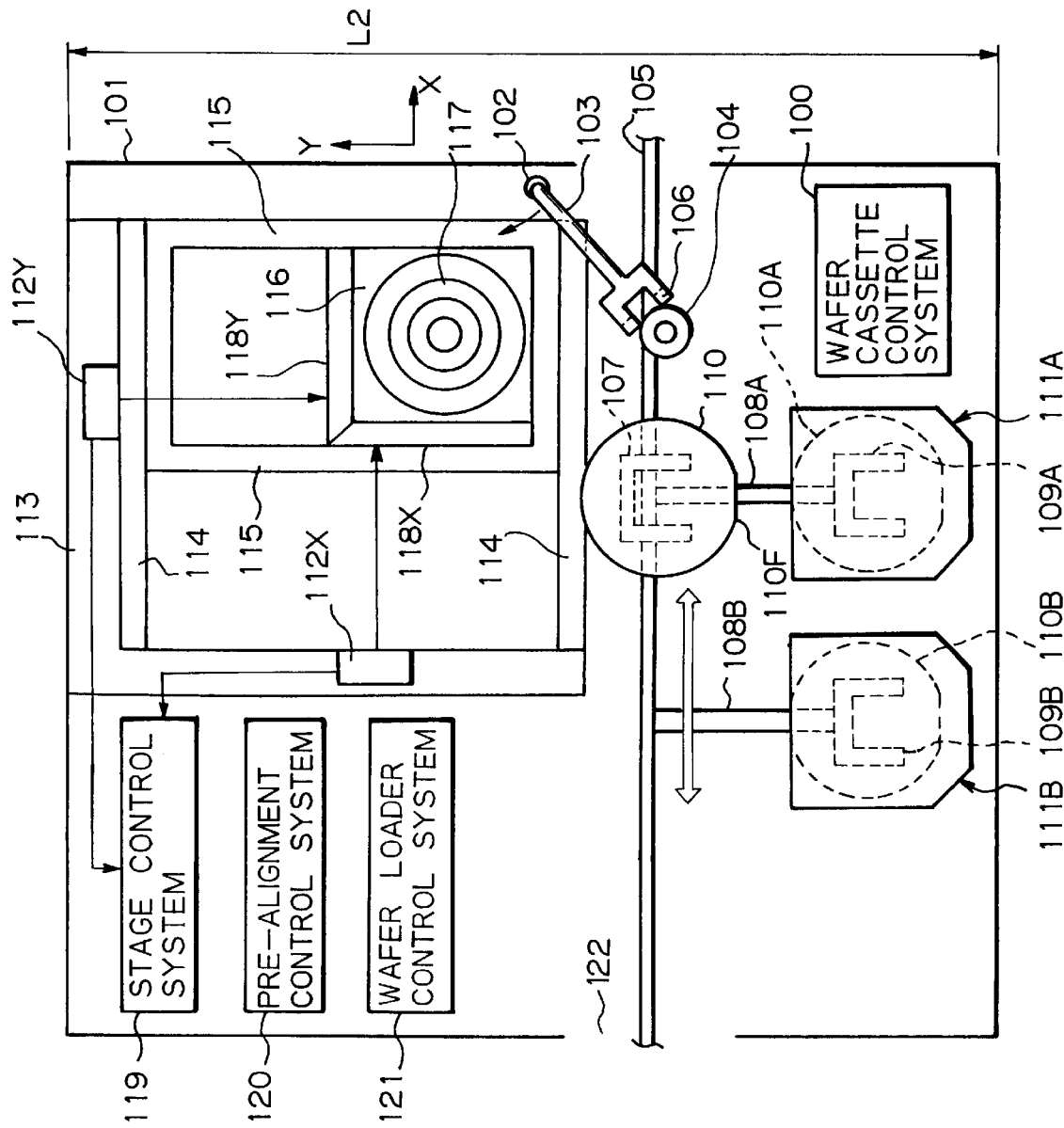
FIG. 6 is a plan view showing one example of conventional substrate transport apparatuses.

FIG. 6 shows a conventional wafer transport apparatus. Referring to FIG. 6, the whole exposure equipment is set up in an installation area (foot print) 101, including an exposure system having an illumination system, a reticle stage, a projection optical system, a wafer stage, etc., a reticle loader, a wafer loader, and a frame for retaining these devices. In the exposure equipment, an area that covers the wafer stage, the wafer loader and their vicinities needs the largest space. These portions are also shown in FIG. 6. In this arrangement, X- and Y-axes are taken in respective directions which are parallel to the plane of a wafer stage 116, and a Z-axis in a direction perpendicular to the X- and Y-axes.

In FIG. 6, a wafer holder 117 is mounted on the wafer stage 116 to hold a wafer 110 by vacuum. Further, a moving mirror 118X for the X-axis and a moving mirror 118Y for the Y-axis are fixed on the wafer stage 116. The positions of the moving mirrors 118X and 118Y are monitored by a laser interferometer 112X for the X-axis and a laser interferometer 112Y for the Y-axis, respectively, which are fixed to a frame 113. Thus, the position in the directions X and Y of the wafer stage 116 is measured by the laser interferometers 112X and 112Y and the moving mirrors 118X and 118Y. Values measured by the laser interferometers 112X and 112Y are supplied to a stage control system 119. The stage control system 119 controls the wafer stage 116 on the basis of these measured values through a drive system comprising a linear motor (not shown) and air guide systems 114 and 115.

The wafer 110 is moved in the directions X and Y as desired by the wafer stage system having the above-described arrangement, and a pattern formed on a reticle is repeatedly transferred onto shot regions on the wafer 110 by an exposure operation. Upon completion of the exposure operation, the wafer 110 is replaced with a new one.

The wafer 110 which has undergone the exposure operation is delivered from the loading position of the wafer stage system to the wafer loader system by a wafer rotating arm 103 which is rotated by a rotating arm drive member 102 provided in the vicinity of the wafer stage 116.

The wafer loader system comprises a portion of an in-line system for externally feeding a wafer into the exposure system, an alignment mechanism for pre-aligning a wafer on the basis of the external configuration or the like of the wafer, and a wafer cassette installation part which is used for temporarily storing a wafer defective in exposure and for storing wafers to be subjected to exposure in the stand-alone mode. The term "stand-alone mode" used herein is employed to mean that exposure is carried out with respect to wafers already stored in a wafer cassette without externally feeding new wafers into the exposure system. In this regard, a system in which exposure is carried out with respect to new wafers which are steadily fed in from the outside of the exposure system is referred to as "in-line system".

First, the operation of the wafer transport apparatus using the in-line system will briefly be explained below. A new wafer 110 is fed in from a wafer inlet 122 along a transport guide 105 in a state of being held by vacuum on a robot arm 107. A pre-alignment mechanism 104 is installed by the transport guide 105 and near the wafer loader-side rotational position of a U-shaped distal end portion 106 of the wafer rotating arm 103. The wafer 110 carried by the robot arm 107 is transferred to the pre-alignment mechanism 104. After holding the wafer 110 by vacuum, the pre-alignment mechanism 104 rotates several turns according to a command from a pre-alignment control system 120. During this operation, an unshown sensor detects, for example, the position of an orientation flat 110F of the wafer 110, and sets the wafer 110 so that the orientation flat 110F coincides with a predetermined circumferential position. Thus, the wafer 110 is pre-aligned. Thereafter, the pre-alignment mechanism 104 delivers the wafer 110 to the wafer rotating arm 103. The wafer 110 which is held by vacuum on the U-shaped distal end portion 106 of the wafer rotating arm 103 is moved to the loading position of the wafer stage system by the rotation of the wafer rotating arm 103 and then delivered onto the wafer stage 116 which is standing by, thus completing a series of operations concerning the in-feed of the new wafer 110.

Exposure is carried out with respect to the wafer 110 placed on the wafer stage 116, as described above. When it has been normally exposed, the wafer 110 is fed out to the outside of the system through a wafer outlet. However, if it has failed to be normally exposed due to a failure or other reason, the wafer 110 is transferred to a wafer cassette 111A or 111B provided in the wafer cassette installation part for temporarily storing wafers, which is disposed at a position in the direction −Y with respect to the transport guide 105, and the wafer 110 is temporarily stored in the wafer cassette 111A or 111B. It should be noted that in order to prevent the exposure sequence from being interrupted during that time, the series of operations are controlled by a wafer loader control system 121.

Next, the operation of the wafer transport apparatus in the stand-alone mode will be explained below. The wafer cassettes 111A and 111B are each designed to store several tens of wafers. In the stand-alone mode, wafers 110A and 110B are taken out of the wafer cassettes 111A and 111B by robot arms 109A and 109B, which are guided by transport guides 108A and 108B connected to the wafer cassettes 111A and 111B, respectively, and then delivered to the robot arm 107 for transport. The wafer 110A or 110B delivered to the robot arm 107 is carried to the wafer stage system in the same way as in the case of the new wafer 110 in the in-line mode described above. Then, exposure is carried out. The series of operation are efficiently controlled by a wafer cassette control system 100.

In the above-described conventional technique, the horizontal (direction Y) space for transport of the wafer 110 and the horizontal space for installation of the wafer cassettes 111A and 111B are provided independently of each other. Therefore, the width L2 in the direction Y of the installation area 101 becomes undesirably long, causing the exposure system to occupy a large space in the chamber where it is installed.

Figure 1B:
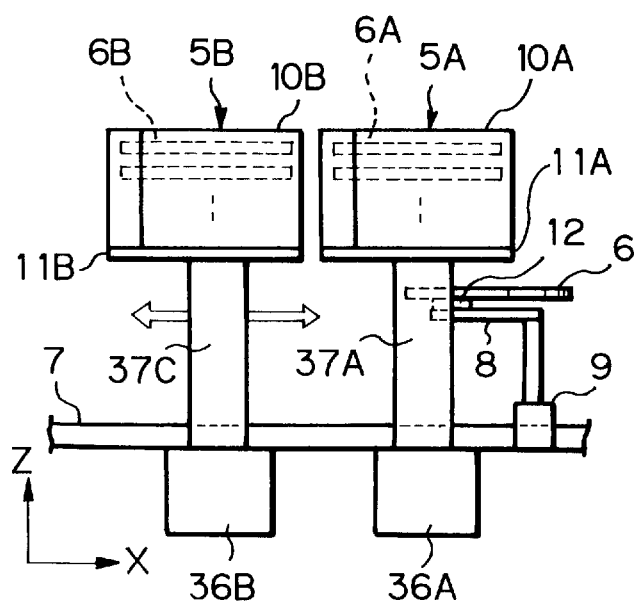
Figure 1C:
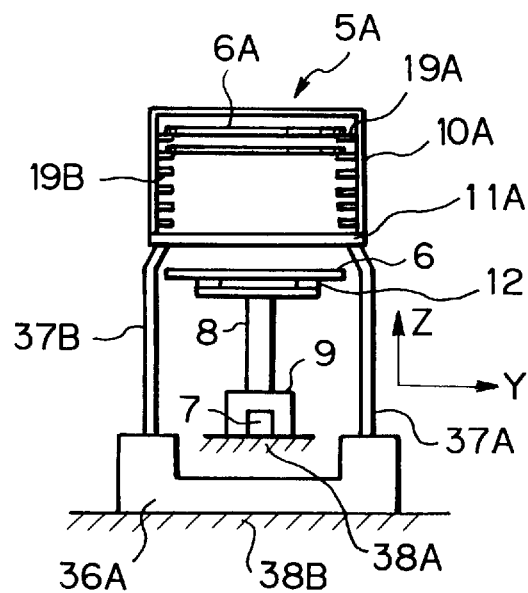

Next, one embodiment of the substrate transport apparatus according to the present invention will be described with reference to FIGS. 1A to 2B. In this embodiment, the present invention is applied to a wafer transport apparatus used in an exposure system which transfers a pattern formed on a reticle onto a wafer. In FIGS. 1A to 1C, members or portions corresponding to those shown in FIG. 6 are denoted by the same reference numerals, and detailed description thereof is omitted.

FIG. 1A is a plan view schematically showing the arrangement of a substrate transport apparatus in this embodiment. FIG. 1B is a front view of a wafer cassette portion in the apparatus shown in FIG. 1A. FIG. 1C is a side view of the wafer cassette portion shown in FIG. 1B. Referring to FIG. 1A, a wafer stage system similar to that shown in FIG. 6 and the substrate transport apparatus of this embodiment are installed in an installation area (foot print) 1. In this embodiment, a wafer cassette installation part for temporarily storing a wafer is disposed to lie over a transport guide 7 with a predetermined space between the installation part and the transport guide. Let us take X- and Y-axes in respective directions which are parallel to the plane of a wafer stage 116, and a Z-axis in a direction perpendicular to the X- and Y-axes, in the same way as in FIG. 6. With the thus defined coordinate system, the arrangement of a wafer loader part including the substrate transport apparatus will be explained below.

A new wafer 6 is fed in from a wafer inlet 3 in a state of being held by vacuum on a wafer suction-holding portion 12 provided on the distal end of a robot arm 8, which is driven by a drive mechanism 9 along the transport guide 7 fixed to a base 38A, and carried to a position above a pre-alignment mechanism 104, passing under wafer cassettes 5B and 5A which are disposed directly above a wafer transport path 2 shown by the chain line. Then, the wafer 6 is delivered to the pre-alignment mechanism 104 from the robot arm 8. FIGS. 1A to 1C show a state in which the robot arm 8 is passing directly under the wafer cassette 5A. It should be noted that the term "wafer transport path 2" used herein is employed to mean "a space provided exclusively for moving the wafer 6".

The pre-alignment mechanism 104 is driven to move vertically (in the direction Z) by a drive system (not shown). The pre-alignment mechanism 104 is also driven to rotate to pre-align the wafer 6, as has been described in regard to FIG. 6. A rotating arm 103 delivers the wafer 6 between the pre-alignment mechanism 104 and the wafer stage 116. A distal end portion 106 of the rotating arm 103 is provided with a suction mechanism for securely holding the wafer 6 on the surface thereof by vacuum so that the wafer 6 will not be displaced inadvertently during rotation of the arm 103.

The wafer 6 delivered to the pre-alignment mechanism 104 and pre-aligned thereon is transferred to the distal end portion 106 of the rotating arm 103 of the wafer stage system and then carried onto a wafer stage 116 by the rotation of the rotating arm 103 in the same way as in the conventional system. After the wafer 6 has been strictly positioned, a pattern formed on a reticle is transferred onto the wafer 6 by an exposure operation.

A wafer which has been normally exposed is returned to the transport guide 7 and fed out to the outside of the installation area 1 through a wafer outlet 4 by the operation of the robot arm 8. However, a wafer which has failed to be normally exposed is temporarily stored in a predesignated wafer cassette 5A or 5B. The wafer cassettes 5A and 5B have the same arrangement, and are provided directly above the transport guide 7. The robot arm 8 passes through a tunnel-shaped passage which is defined by drive members (e.g. 37A and 37B; described later) for driving the wafer cassettes 5A and 5B and cassette retaining members 11A and 11B. In addition, side flow ventilation is carried out to create a dust-free environment.

The wafer cassettes 5A and 5B are formed from casings 10A and 10B, respectively, each of which comprises opposite side walls extending in planes parallel with the X-Z plane, an upper wall extending in a plane parallel with the X-Y plane and integral with the side walls and rear walls extending in planes parallel with the Z axis and integral with the upper and side walls.

Each of the casings 10A and 10B has a front end (+X side) remote from the rear walls. The front end is open so that the wafer can be put in or out of the casing through the robot arm 8. As shown for example in FIG. 1C, a plurality of shelves 19A and 19B for retaining wafers in a horizontal position are provided on the inner surfaces of both side walls of each of the casings 10A and 10B. The shelves 19A and 19B are disposed at respective positions which are symmetrical with respect to a center line of the casing that extends in the direction Z. FIGS. 1B and 1C show a state where wafers 6A and 6B have already been held on the shelves in the wafer cassettes 5A and 5B. The wafer cassettes 5A and 5B are detachably installed on the respective cassette retaining members 11A and 11B. As shown for example by the wafer cassette 5A in FIG. 1C, the wafer cassette is vertically driven by a wafer up-down mechanism 36A, which is fixed to a base 38B, through drive members 37A and 37B which are fixed to the reverse side of the cassette retaining member 11A. The wafer cassette 5B is also vertically driven by a wafer up-down mechanism 36B. In FIG. 1B, however, only one drive member 37C is shown.

Next, the operation of the substrate transport apparatus according to this embodiment will be explained with reference to FIGS. 2A and 2B.

Figure 2A:
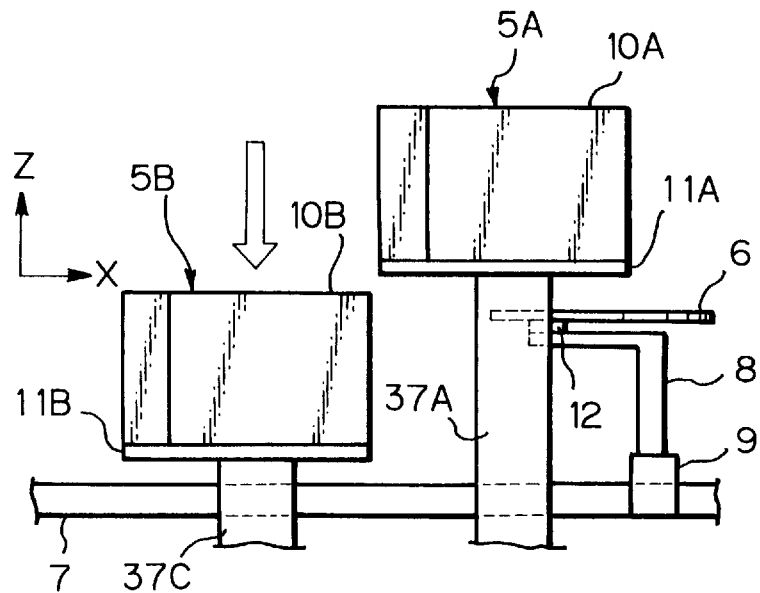
FIGS. 2A and 2B illustrate the operation of the substrate transport apparatus shown in FIGS. 1A to 1C.
Figure 2B:
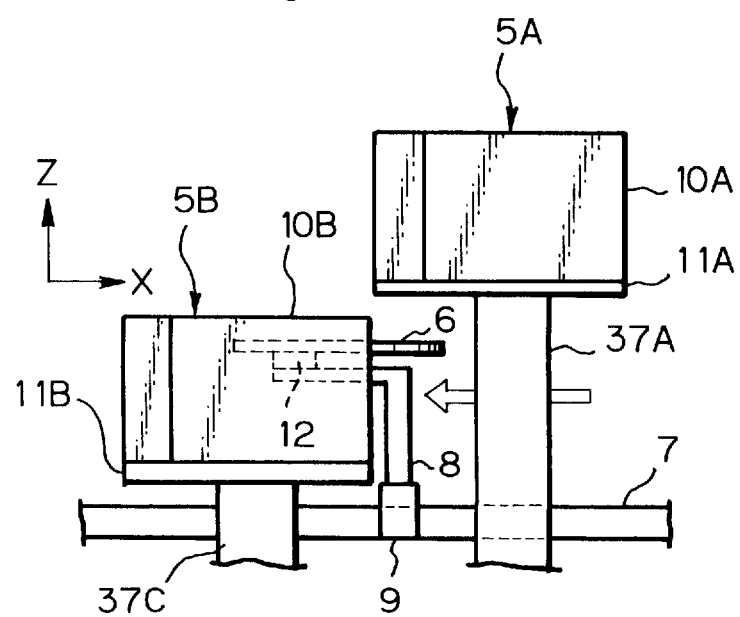

FIGS. 2A and 2B are views for explanation of the operation of the substrate transport apparatus according to this embodiment. FIG. 2A shows an essential part of the apparatus in a state where the wafer cassette 5B is moved downward to store a wafer 6 therein. FIG. 2B shows the essential part of the apparatus in a state where the wafer 6 is entering the wafer cassette 5B so as to be stored therein. As has been described above, a wafer 6 which has failed to be normally exposed is transferred from the wafer stage 116 (shown in FIG. 1A) to the robot arm 8. Thereafter, the wafer 6 is carried along the transport guide 7 by the robot arm 8 and stored into the wafer cassette 5A or 5B. In the illustrated case, the wafer 6 is to be stored into the wafer cassette 5B. Therefore, as shown in FIG. 2A, before the wafer 6 enters the wafer cassette 5B, the wafer cassette 5B is moved downward to a position convenient for a pair of shelves in the wafer cassette 5B (which are identical with a pair of shelves 19A and 19B in the wafer cassette 5A) to receive the wafer 6.

Then, the robot arm 8 passes under the wafer cassette 5A, which is disposed in front of the wafer cassette 5B, and enters the wafer cassette 5B, which has been lowered to a predetermined position, to transfer the wafer 6 onto the shelves 19A and 19B. After the wafer 6 has been stored in the wafer cassette 5B, the robot arm 8 returns to a position where the wafer suction-holding portion 12 thereof will not interfere with the vertical movement of the wafer cassette 5B, and waits at that position. After the wafer cassette 5B has moved to the retracted position, the robot arm 8 passes under the wafer cassette 5B and moves on the transport guide 7 to the wafer inlet 3 to feed in a new wafer.

The above-described series of operations are carried out by a wafer loader control system 121 and a main control system 88, which are shown in FIG. 1A. The main control system 88 always keeps in memory information about the location of each particular wafer stored on shelves in the wafer cassette 5A or 5B, and it controls the system so that a wafer to be stored subsequently is invariably put on a pair of empty shelves in the wafer cassette 5A or 5B.

Thus, according to the substrate transport apparatus of this embodiment, the wafer cassettes 5A and 5B for storing wafers are provided vertically above (in the direction Z) the wafer transport path 2. Accordingly, as understood from FIG. 1A, the width L1 in the direction Y of the installation area 1 is shorter than the width L2 in the direction Y of the installation area 101 in the conventional apparatus (shown in FIG. 6) by the width in the direction Y of the wafer cassettes 5A and 5B. Further, the conventional apparatus needs to provide an extra transport robot for storing a wafer into a wafer cassette, as shown in FIG. 6, and requires an operation for transferring a wafer to the extra transport robot. In contrast to the conventional technique, the substrate transport apparatus of this embodiment does not need such an extra transport robot and a wafer transferring operation. Accordingly, the arrangement of the apparatus is simplified, and the productivity (throughput) improves.

Next, another embodiment of the substrate transport apparatus according to the present invention will be explained with reference to FIGS. 3A to 4B. In this embodiment, the substrate transport apparatus is arranged such that the wafer 6 can pass through a wafer cassette along the transport guide 7, unlike the embodiment shown in FIGS. 1A to 1C, in which a wafer cassette is disposed directly above the wafer transport path 2, and the wafer cassette is lowered down to the wafer transport path 2 when a wafer is to be stored therein. However, the arrangement of the rest of the apparatus is the same as that in the embodiment shown in FIGS. 1A to 1C. Accordingly, members or portions corresponding to those shown in FIGS. 1A to 1C are denoted by the same reference numerals, and detailed description thereof is omitted.

Figure 3A:
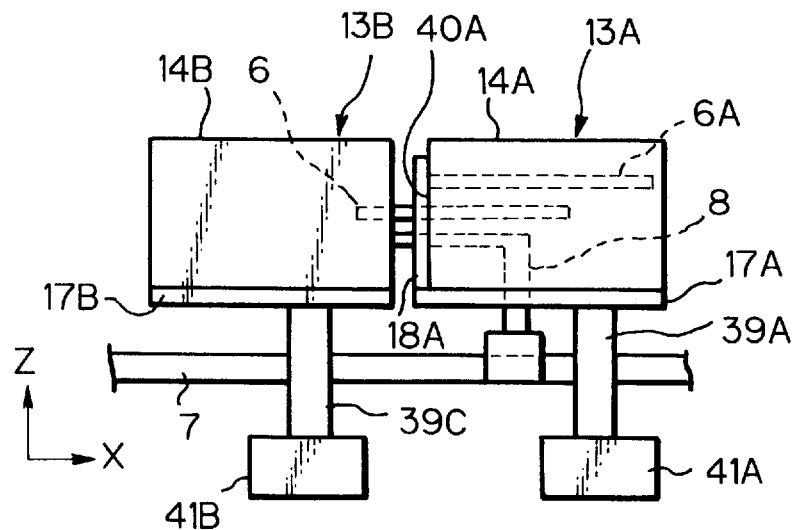
FIG. 3A schematically shows the arrangement of an essential part of another embodiment of the substrate transport apparatus according to the present invention.
Figure 3B:
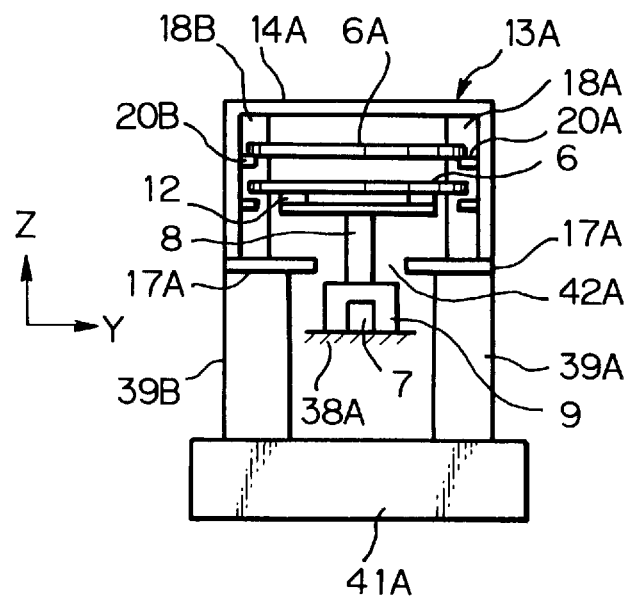
FIG. 3B is a side view of the essential part shown in FIG. 3A.

FIG. 3A is a front view showing the arrangement of an essential part of the substrate transport apparatus in this embodiment, including wafer cassettes and peripheral members associated therewith. FIG. 3B is a side view of the essential part shown in FIG. 3A. Referring to FIGS. 3A and 3B, wafer cassettes 13A and 13B are formed from casings 14A and 14B, respectively, each of which comprises opposite side walls extending in planes parallel with the X-Z plane and upper wall extending in a plane parallel with the X-Y plane and integral with the side walls. As shown for example in FIG. 3B, a plurality of shelves 20A and 20B for retaining wafers in a horizontal position are provided on the inner surfaces of the side walls of each of the casings 14A and 14B. The shelves 20A and 20B are disposed at respective positions which are symmetrical with respect to a center line of the casing that extends in the direction Z. FIGS. 3A and 3B show a state where a wafer 6A has already been held on the shelves in the wafer cassette 13A.

The wafer cassettes 13A and 13B are detachably installed on the respective cassette retaining members 17A and 17B.

As shown for example by the wafer cassette 13A in FIG. 3B, the wafer cassette is vertically driven by a wafer up-down mechanism 41A through drive members 39A and 39B which are fixed to the reverse side of the cassette retaining member. The wafer cassette 13B is also vertically driven by a wafer up-down mechanism 41B. In FIG. 3A, however, only one drive member 39C is shown. It should be noted that, unlike the cassette retaining members 11A and 11B in the embodiment shown in FIGS. 1A to 1C, each of the cassette retaining members 17A and 17B comprises a pair of rectangular plates extending in the X-direction and spaced in parallel with each other in the Y-direction so that the robot arm 8 can pass through it. As shown for example by the opening 42A of the cassette retaining member 17A in FIG. 3B, the width in the direction Y of the space or opening 42A is made greater than the width in the direction Y of the drive mechanism 9 for the robot arm 8 so that the drive mechanism 9 will not interfere with the vertical movement of the cassette retaining base 17A.

The arrangement of the wafer cassette 13A will be explained below.

Figure 4A:
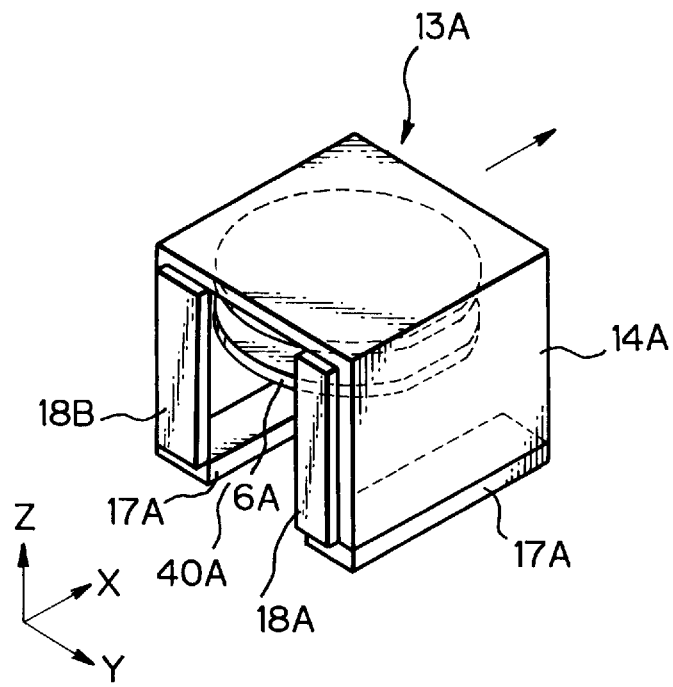
FIGS. 4A and 4B are perspective views for explaining the operation of a wafer cassette shown in FIGS. 3A and 3B.

FIG. 4A is a perspective view of the wafer cassette 13A. The wafer cassette is mounted on the cassette retaining member 17A. Referring to FIG. 4A, the wafer cassette 13A has an opening 40A which faces the wafer inlet 3. A pair of doors 18A and 18B are fixed to the opposite side walls of the wafer cassette 13A through hinges so that the opening 40A can be opened and closed by the doors 18A and 18B. The end of the wafer cassette 13A that is opposite to the opening 40A is entirely open so that the robot arm 8, together with a wafer, can freely come in and out of the wafer cassette 13A. The doors 18A and 18B are provided to prevent (protect) a wafer from being moved in the direction −X so that the wafer can be taken out only in the direction +X, indicated by the arrow.

Figure 4B:
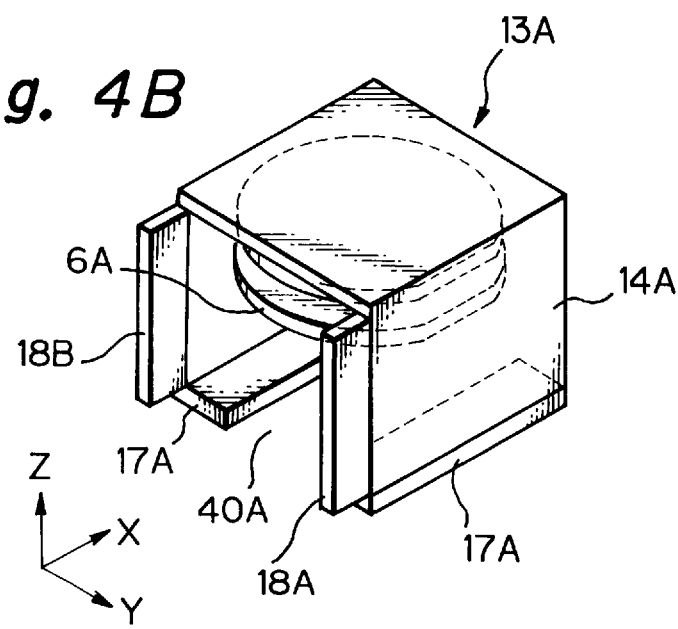

FIG. 4A shows the wafer cassette 13A in a state where wafers 6A stored therein are protected, and FIG. 4B shows the wafer cassette 13A in a state where the doors 18A and 18B are open, and hence the stored wafers 6A are unprotected. For example, when the wafer cassette 13A is to be detached from the cassette retaining member 17A, the doors 18A and 18B are closed to protect the stored wafers 6A, as shown in FIG. 4A, thereby preventing the wafers 6A from falling. Even in this state that the doors are closed, the robot arm 8 can freely enter the wafer cassette and get out of it. When the stored wafers 6A are unprotected, as shown in FIG. 4B, they can be moved in the direction −X through the opening 40A. It should be noted that the doors 18A and 18B are automatically opened by installing the wafer cassette 13A on the cassette retaining base 17A, thereby allowing the wafers 6A to be automatically unprotected. It should also be noted that the wafer cassette 13B has the same arrangement as that of the wafer cassette 13A.

Next, the operation of the substrate transport apparatus in this embodiment will briefly be explained. Although the following explanation is given for the wafer cassette 13A, the same is the case with the wafer cassette 13B.

In the substrate transport apparatus of this embodiment, the wafer 6 placed on the robot arm 8 moves in such a manner as to pass through the space between the shelves 20A and 20B in the wafer cassette 13A. In this embodiment, when a wafer is to merely pass through the wafer cassette 13A without being stored therein, it passes through the space between a predetermined pair of shelves 20A and 20B. Accordingly, when a new wafer is to be carried to the wafer stage system in the in-line mode, the wafer cassette 13A is in an unprotected state, as described above, and the new wafer passes through the wafer cassette 13A along the transport guide 7, together with the robot arm 8, and is carried to the pre-alignment mechanism 104. Then, exposure is carried out in the same way as in the embodiment shown in FIGS. 1A to 1C.

A wafer 6 which has failed to be normally exposed is delivered onto the robot arm 8 from the wafer stage system and moved, together with the robot arm 8, toward the wafer inlet 3 along the transport guide 7. When the wafer 6 on the robot arm 8 has been positioned in the wafer cassette 13A, the suction operation of the wafer suction-holding portion 12 of the robot arm 8 is suspended, and at the same time, the wafer cassette 13A is vertically moved (upward or downward) to a predetermined position by the wafer up-down mechanism 41A, and then the wafer 6 is transferred onto a predetermined pair of shelves 20A and 20B in the wafer cassette 13A. After the wafer 6 has been stored in the wafer cassette 13A, the wafer cassette 13A is positioned by the wafer up-down mechanism 41A so that the wafer passage lies at a predetermined position in the wafer cassette 13A.

Thus, according to the substrate transport apparatus of this embodiment, the wafer transport path 2 extends through the wafer cassettes 13A and 13B. Therefore, it is possible to reduce the space occupied by the apparatus not only in the direction Y but also in the vertical direction (direction Z) in comparison to the embodiment shown in FIGS. 1A to 1C. Further, since the vertical travel of the wafer cassettes 13A and 13B becomes shorter than in the embodiment shown in FIGS. 1A to 1C, the time required for driving the wafer cassettes 13A and 13B shortens, and thus the productivity (throughput) improves. In addition, when both the wafer cassettes 13A and 13B are in an unprotected state, after a wafer 6 which could not normally be exposed has been stored in the wafer cassette 13A or 13B, the robot arm 8 can be moved toward the wafer inlet 3 without vertically moving the wafer cassettes 13A and 13B.

Although in this embodiment the wafer cassettes 13A and 13B are arranged so that only one side thereof that faces in the direction −X can be protected, if both the X-direction sides of the wafer cassettes 13A and 13B are arranged to be protected, there is no danger of a wafer falling when the wafer cassettes 13A and 13B are carried, and thus the wafer cassettes 13A and 13B can be safely transferred.

Although in the foregoing two embodiments wafer cassettes are provided above the wafer transport path, it should be noted that wafer cassettes may be provided below the wafer transport path. In this case also, the same function can be exhibited. Further, although in the foregoing embodiments a wafer cassette is vertically driven to transfer a wafer, the same effect can be obtained by arranging the system so that a wafer is transferred by vertically moving the robot arm.

Next, still another embodiment of the substrate transport apparatus according to the present invention will be explained with reference to FIGS. 5A to 5C. In this embodiment, the apparatus is arranged such that a wafer is carried in a slanting or upright position. The arrangement of the rest of the apparatus, that is, the arrangement of the wafer stage and its vicinities, is the same as that in the embodiment shown in FIGS. 1A to 1C.

Figure 5A:
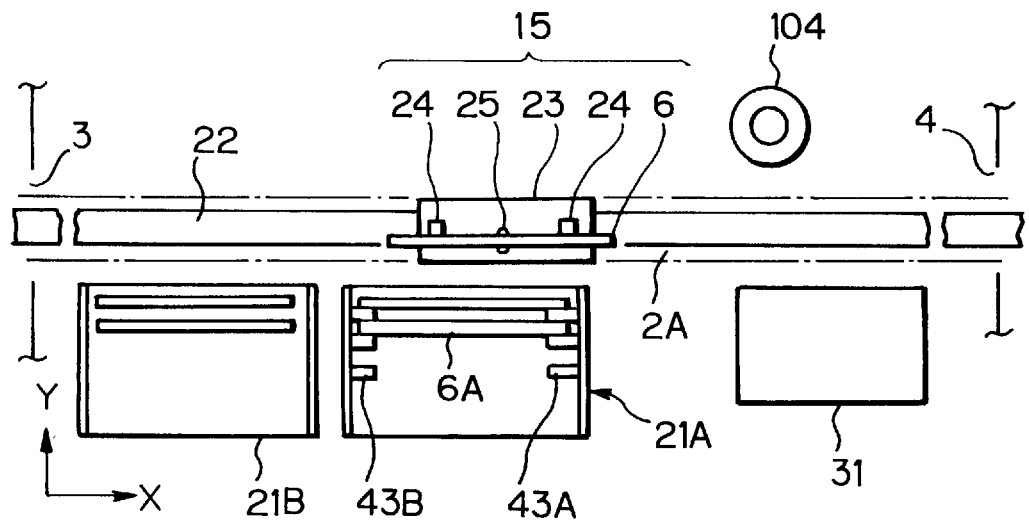
FIG. 5A schematically shows the arrangement of an essential part of still another embodiment of the substrate transport apparatus according to the present invention.
Figure 5B:
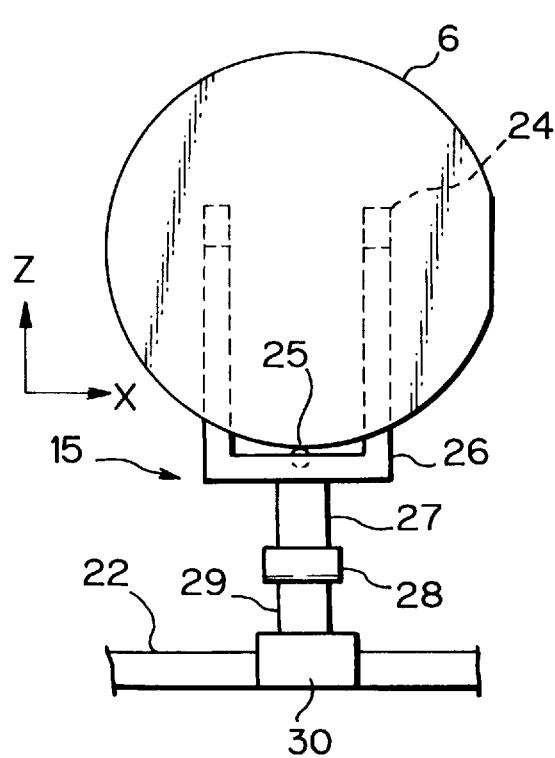
FIG. 5B is a front view showing the arrangement of a robot arm shown in FIG. 5A.
Figure 5C:
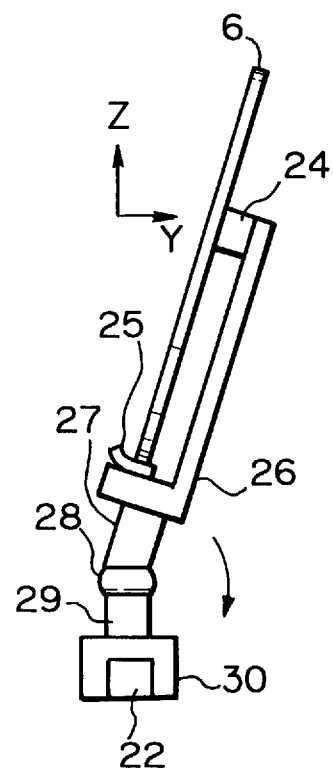
FIG. 5C is a side view of the robot arm shown in FIG. 5B.

FIG. 5A is a plan view schematically showing the arrangement of the substrate transport apparatus in this embodiment. FIG. 5B is an enlarged front view of a robot arm, and FIG. 5C is a side view of the robot arm. Referring to FIG. 5A, wafer cassettes 21A and 21B are disposed side by side at a side (in the direction −Y) of a transport path 2A for a wafer 6 and a robot arm 15, which is shown by the chain line in the figure. In the in-line mode, the wafer 6 is held by vacuum on the robot arm 15, which moves along a transport guide 22 extending from a wafer inlet 3 to a wafer outlet 4, and it is carried from the wafer inlet 3 to a pre-alignment mechanism 104, passing by the sides of the wafer cassettes 21A and 21B.

The robot arm 15 carries the wafer 6 in an upright position, and transfers it to the pre-alignment mechanism 104 in a horizontal position. Therefore, the robot arm 15 has an arrangement different from that of the robot arm 8 in the embodiment shown in FIGS. 1A to 1C. As shown in FIGS. 5B and 5C, the robot arm 15 has a drive mechanism 30 for driving the robot arm 15 along the transport guide 22, a wafer angle control mechanism 27 to 29 which is connected to the drive mechanism 30 to erect and lay a wafer, and an arm 26 which is provided with a wafer suction-holding member 24 for holding a wafer by vacuum, and a wafer supporting roller 25 for supporting the lower end of the wafer held by the wafer suction-holding member 24. When the wafer 6 is to be delivered from the robot arm 15 to the pre-alignment mechanism 104, the wafer angle control mechanism 27 to 29 is driven when the robot arm 15 reaches a position before the pre-alignment mechanism 104 so as to move the wafer 6 in the direction of the arrow in FIG. 5C, thereby putting the wafer 6 down to a horizontal position. In this state, the wafer 6 is placed onto the pre-alignment mechanism 104.

Unlike the wafer cassettes 5A and 5B shown in FIGS. 1A to 2B, the wafer cassettes 21A and 21B store wafers in an upright position. Therefore, the wafer cassettes 21A and 21B each have an opening provided in the top and are detachably installed on respective cassette retaining members (not shown). Further, as shown for example by the wafer cassette 21A, two sides that face opposite each other in the direction X are provided with a plurality of shelves 43A and 43B for spacing wafers apart from each other and, at the same time, for retaining wafers in an upright position. FIG. 5A shows a state where wafers 6A have already been stored in the space between the shelves 43A and 43B in the wafer cassette 21A.

A wafer 6 which has failed to be normally exposed is delivered to the robot arm 15 from the wafer stage system through the rotating arm 103 and the pre-alignment mechanism 104 in the same way as in the embodiment shown in FIGS. 1A to 1C, and then stored into the wafer cassette 21A or 21B through a wafer delivery mechanism 31 which is provided in the vicinity of the wafer cassettes 21A and 21B. In this case, the wafer 6 is stored into the wafer cassette 21A or 21B from the opening in the top thereof in an upright position by the delivery mechanism 31.

Thus, according to the substrate transport apparatus of this embodiment, a wafer is carried in an upright position in a system wherein a wafer is exposed in a horizontal position. Therefore, the width in the direction Y of the transport path 2A for a wafer and the robot arm 15 becomes extremely narrow in comparison to a conventional apparatus in which a wafer is carried in a horizontal position. Accordingly, it is possible to minimize the width in the direction Y of the installation area 1. Further, since a wafer is carried in an upright position, the amount of dust attached to the wafer surface advantageously reduces.

Although the foregoing three embodiments have been described in connection with an operation which is carried out when an exposure failure occurs in the in-line mode, the substrate transport apparatus of the present invention can similarly be used in the stand-alone mode in which wafer cassettes each accommodating a plurality of new wafers are employed.

In a case where exposure is carried out in the stand-alone mode in the third embodiment, for example, a wafer is taken out from the wafer cassette 21A or 21B by the delivery mechanism 31 and delivered to the pre-alignment mechanism 104 through the robot arm 15. Thus, exposure is carried out in the same way as in the embodiment shown in FIGS. 1A to 1C. That is, the delivery mechanism 31 is not used when exposure is normally carried out in the in-line mode, but it is used when exposure has failed to be normally carried out in the in-line mode, or when the system is run in the off-line mode (i.e. in the stand-alone mode). Regarding the control system, all the operations of the wafer loader part are controlled by the wafer loader control system 121, and all the above-described series of operations are controlled by the main control system 88 in the same way as in the embodiment shown in FIGS. 1A to 1C.

Although in all the foregoing embodiments wafer cassettes are disposed between the pre-alignment mechanism 104 and the wafer inlet 3, it should be noted that wafer cassettes may be disposed in the vicinity of the wafer outlet 4. Alternatively, wafer cassettes may be disposed at both a position between the pre-alignment mechanism 104 and the wafer inlet 3 and a position near the wafer outlet 4.

In the foregoing embodiments, the invention is applied to a wafer transport apparatus. However, the invention is also applicable to a reticle loader system or any other systems for transporting a substrate.

According to the substrate transport apparatuses of the first and second embodiments of the present invention, a storage member for storing a substrate is disposed vertically above or below a substrate (wafer) transport path. Therefore, the space for installation of the substrate transport apparatus can be reduced in comparison to the conventional apparatus. Accordingly, when the substrate transport apparatus of the present invention is used in an exposure system, for example, it is possible to reduce the overall size of the exposure system. That is, the foot print can be favorably reduced.

In a case where a drive device for vertically moving the storage member is provided so that when a substrate is to be loaded into and unloaded from the storage member, the storage member is moved onto the transport path through the drive device, it is possible to deliver the substrate into the storage member by only a slight vertical movement of the storage member, and thus the processing speed improves.

In a case where a movement preventing member is provided to prevent a substrate stored in the storage member from moving in a predetermined direction along the transport path, it is possible to prevent movement in a predetermined direction of the substrate stored in the storage member. Accordingly, when the storage member is, for example, a wafer cassette used in an exposure system, it is possible to prevent the wafer from falling when the wafer cassette is moved.

According to the substrate transport apparatus of the third embodiment of the present invention, the space for installation of the substrate transport apparatus is advantageously minimized because a substrate is carried in a slanting or upright position. Further, the amount of dust attached to the substrate surface reduces favorably.

What is claimed is:

1. An exposure apparatus comprising:
   a substrate stage by which a substrate is supported in a position at which the substrate is irradiated with exposure light;
   a pre-alignment mechanism which pre-aligns said substrate before the substrate is positioned on said substrate stage;
   a first transport system which transports the substrate while supporting the same in a generally vertical position, thereafter changes of the posture of the substrate into a horizontal position and transfers the same to said pre-alignment mechanism; and
   a second transport system which transfers said substrate from said pre-alignment mechanism to said substrate stage.

2. An exposure apparatus according to claim 1, wherein said second transport system transfers said substrate from said pre-alignment mechanism to said substrate stage while supporting the same in a horizontal position.

3. An exposure apparatus according to claim 1, further comprising a storage member which stores substrates to be transported by said first transport system, said storage member storing said substrates in generally vertical positions.

4. An exposure apparatus comprising:
   a substrate stage having a support surface on which a substrate is supported in a position at which the substrate is irradiated with exposure light;
   a transport system which transports said substrate from a transport initiation position to said support surface, said transport system being provided with a supporting mechanism which supports the substrate in a generally vertical position in at least a part of the way from said transport initiation position to said support surface; and
   a pre-alignment mechanism provided in a path of transportation of the substrate from said transport initiation position to said support surface to pre-align said substrate, wherein said supporting mechanism supports the substrate in an upright position with respect to the plane of said support surface during transportation of the substrate from said transport initiation position to said pre-alignment mechanism.

5. An exposure apparatus according to claim 4, wherein said substrate is carried in a position parallel with the plane of said support surface while it is transferred from said pre-alignment mechanism to said support surface.

6. An exposure apparatus according to claim 4 further comprising a storage member provided at said transport initiation position for storing substrates in upright positions with respect to the plane of said support surface.

7. A method of transporting a substrate for exposure on a substrate stage, comprising the steps of:
   transporting the substrate along a path, while supporting the substrate in a generally vertical position;
   changing the orientation of the substrate into a generally horizontal position;
   transferring the substrate to a pre-alignment mechanism; and
   transferring the substrate from the pre-alignment mechanism to the substrate stage.

8. The method of transporting a substrate for exposure according to claim 7, wherein said generally vertical position includes a slanting position.

9. The method of transporting a substrate for exposure according to claim 7, further comprising a step of storing the substrate in a storage member in a generally vertical position, and a step of retrieving the substrate from the storage member before the transporting step.

10. The method of transporting a substrate for exposure according to claim 7, further comprising the step of transferring the substrate from the substrate stage to a storage member in which the substrate is stored in a generally vertical position.

11. A method of transporting a substrate for exposure on a substrate stage, comprising the steps of:
    transporting a substrate along a path while supporting the substrate in a generally vertical position, by a first transport system,
    changing the orientation of the substrate into a generally horizontal position, by the first transport system,
    transferring said substrate to a support surface on the substrate stage.

12. The method of transporting a substrate for exposure on a substrate stage according to claim 11, further comprising the step of transferring the substrate to a pre-alignment mechanism after changing the orientation of the substrate to a generally horizontal position and before transferring the substrate to the support surface on the substrate stage.

13. The method of transporting a substrate for exposure on a substrate stage according to claim 11, wherein said generally vertical position includes a slanting position.

14. The method of transporting a substrate for exposure on a substrate stage according to claim 11, further comprising the steps of storing the substrate in a storage member in a generally vertical position, and retrieving the substrate from the storage member before the transporting step.

15. The method of transporting a substrate for exposure on a substrate stage according to claim 11, further comprising the step of transferring the substrate from the support surface on the substrate stage to a storage member in which the substrate is stored in a generally vertical position.

16. An exposure apparatus comprising:
    a substrate stage having a support surface on which a substrate is supported in a position at which the substrate is irradiated with exposure light;
    a transport system which transports said substrate from a transport initiation position to said support surface, said transport system being provided with a supporting mechanism which supports the substrate in a generally vertical position in at least a part of the way from said transport initiation position to said support surface; and
    a pre-alignment mechanism which supports said substrate in a horizontal position to pre-align in said path of transportation of the substrate from said transport initiation position to said support surface.

17. An exposure apparatus according to claim 16, wherein said substrate is supported in a generally horizontal position in said support surface.

18. An exposure apparatus according to claim 16 further comprising a storage member provided at said transport initiation position for storing substrates in generally vertical positions.

19. An exposure apparatus according to claim 16, wherein said transport system transfers said substrate from said transport initiation position to said pre-alignment mechanism in a generally vertical position.

20. A method for making an exposure apparatus, the method comprising the steps of:

provided a substrate stage having a support surface on which a substrate is supported in a position at which the substrate is irradiated with exposure light;

providing a transport system which transports said substrate from a transport initiation position to said support surface, said transport system being provided with a supporting mechanism which supports the substrate in a generally vertical position in at least a part of the way from said transport initiation position to said support surface; and providing a pre-alignment mechanism which supports said substrate in a horizontal position to pre-align in said path of transportation of the substrate from said transport initiation position to said support surface.

21. A method according to claim 20, wherein said support surface supports said substrate in a generally horizontal position.

22. A method according to claim 20 further comprising a step of providing a storage member at said transport initiation position for storing substrates in generally vertical positions.

23. A method according to claim 20, wherein said transport system transfers said substrate from said transport initiation position to said pre-alignment mechanism in a generally vertical position.

* * * * *